(12) United States Patent
Thiruvengadam

(10) Patent No.: US 8,194,441 B2
(45) Date of Patent: Jun. 5, 2012

(54) PHASE CHANGE MEMORY STATE DETERMINATION USING THRESHOLD EDGE DETECTION

(75) Inventor: Aswin Thiruvengadam, Mather, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/889,372

(22) Filed: Sep. 23, 2010

(65) Prior Publication Data

US 2012/0075923 A1 Mar. 29, 2012

(51) Int. Cl.
*G11C 11/00* (2006.01)

(52) U.S. Cl. ........................................ 365/163; 365/158

(58) Field of Classification Search .................. 365/163, 365/158
See application file for complete search history.

(56) References Cited

U.S. PATENT DOCUMENTS

| 6,707,712 | B2 * | 3/2004 | Lowery | 365/175 |
| 7,362,608 | B2 * | 4/2008 | Schwerin et al. | 365/163 |
| 7,466,584 | B1 * | 12/2008 | Parkinson et al. | 365/163 |
| 2006/0198183 | A1 * | 9/2006 | Kawahara et al. | 365/163 |
| 2008/0025079 | A1 * | 1/2008 | Philipp et al. | 365/163 |
| 2010/0078620 | A1 * | 4/2010 | Xi et al. | 257/4 |
| 2010/0128516 | A1 * | 5/2010 | Cho et al. | 365/163 |
| 2010/0213432 | A1 * | 8/2010 | Chuang et al. | 257/4 |

* cited by examiner

*Primary Examiner* — Michael Tran
(74) *Attorney, Agent, or Firm* — Berkeley Law & Technology Group, LLP

(57) ABSTRACT

Subject matter disclosed herein relates to techniques to read a memory cell that involve a threshold edge phenomenon of a reset state of phase change memory.

20 Claims, 6 Drawing Sheets

FIG. 7

PHASE CHANGE MEMORY STATE DETERMINATION USING THRESHOLD EDGE DETECTION

BACKGROUND

1. Field

Subject matter disclosed herein relates to techniques to read a memory cell that involve a threshold edge phenomenon of a reset state of phase change memory.

2. Information

Phase change memory (PCM) may operate based, at least in part, on behaviors and properties of one or more particular phase change materials, such as chalcogenide glass and/or germanium antimony telluride (GST), just to name a few examples. Crystalline and amorphous states of such materials have different electrical resistivities, thus presenting a basis by which information may be stored. The amorphous, high resistance state may represent a stored first binary state and the crystalline, low resistance state may represent a stored second binary state. Of course, such a binary representation of stored information is merely an example: PCM may also be used to store multiple memory states, represented by varying degrees of phase change material resistivity, for example.

A determination of a state of a PCM cell may be based, at least in part, on a difference of electrical resistivities of states of the PCM cell. For example, differentiating between a RESET and a SET state of a PCM cell may involve determining a difference of resistance of the PCM cell. However, introduction of new PCM materials and/or continuing reduction in PCM sizes may affect PCM margin of resistance, or read window, between states (e.g., RESET and SET states). For example, a reduced programming window may lead to a narrower readout margin between SET and RESET states. A PCM having a reduced read window may experience a greater number of read errors compared to PCM having a larger read window.

BRIEF DESCRIPTION OF THE FIGURES

Non-limiting and non-exhaustive embodiments will be described with reference to the following figures, wherein like reference numerals refer to like parts throughout the various figures unless otherwise specified.

DETAILED DESCRIPTION

Figure 1:
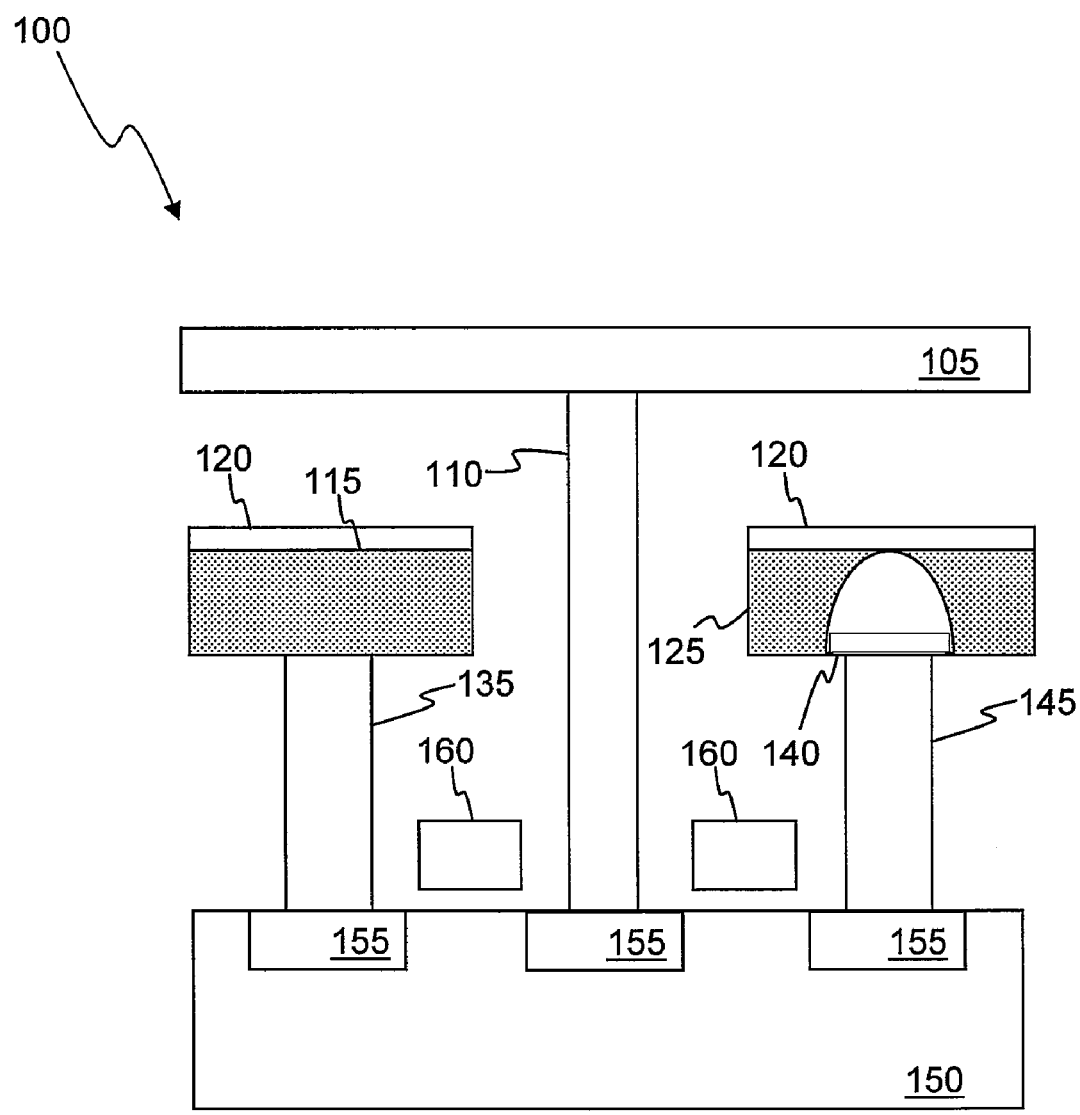
FIG. 1 is a schematic diagram of a portion of phase change memory, according to an embodiment.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

In an embodiment, a process to write information to a phase change memory (PCM) cell may comprise setting or resetting the PCM cell to one state or another. For example, a PCM cell may be reset by melting phase change material by applying a relatively high amplitude, relatively short duration electrical programming pulse. In contrast, a PCM cell may be set by applying a relatively smaller sub-melt amplitude electrical programming pulse having a relatively longer duration, which may include a relatively abrupt drop, for example. A PCM cell may also be set by applying a higher over-melt amplitude electrical programming pulse, possibly having a gradual, sloping drop in voltage or current over time, to allow molten phase change material to crystallize. Such a reset and/or set pulse and process may be applied as a "write" or "program" pulse and a "write" or "program" process.

In an embodiment, a process to read information stored in a PCM cell may comprise determining whether the PCM cell is in a SET state, a RESET state, or other state (e.g., in the case of multilevel PCM). Since such states may correspond to particular PCM resistivities, state determination may involve determining a resistance of a PCM cell. Resistance of a PCM cell may depend, at least in part, on whether phase change material included in the memory cell exists in an amorphous phase and/or a crystalline phase, as discussed above.

In an embodiment, a threshold edge phenomenon that may occur with materials in an amorphous or RESET state of a PCM cell, for example, may be used to determine a state of the PCM cell. A threshold edge may result from applying a bias signal to a PCM cell that is in a RESET state. Such a bias signal, which may be applied to a bitline of a PCM cell, may comprise a ramping voltage/current pulse, as described in further detail below. As the amplitude of such a bias signal is increased (e.g., ramped up), a threshold edge may be encountered, wherein resistivity of the PCM cell precipitously drops during a particular span of increasing bias signal amplitude. In contrast, a PCM cell in a crystalline or SET state may not experience such a threshold edge. For example, as the amplitude of a bias signal is increased (e.g., ramped up), resistivity of a PCM cell in a SET state may remain substantially constant.

In an embodiment, a process of determining a state of a PCM cell may involve detecting whether the PCM cell experiences a threshold edge. For example, if such a threshold edge is detected, then a PCM cell may be considered to be in a RESET state. In contrast, if such a threshold edge is not detected, then a PCM cell may be considered to be in a SET state. In an implementation, detecting whether or not a PCM cell experiences a threshold edge may be performed while a voltage of a bias signal applied to the PCM cell is ramped upward. Occurrence of a threshold edge may be a function of bias signal voltage (e.g., electric field) and time. Therefore snapback may be measured if bias voltage is ramped up or if bias voltage is held constant for a particular amount of time. Of course, such details of threshold edge phenomena are merely examples, and claimed subject matter is not so limited.

In an embodiment, a method to determine a state of a PCM cell may include increasing a magnitude (e.g., voltage or current) of a bias signal applied to the PCM cell in response to a read command, and inferring a value of resistance of the PCM cell by measuring a cell current and/or cell voltage of the PCM cell. The method may further include, while increasing the magnitude of the bias signal, determining whether a substantial decrease in the PCM cell resistance occurs, and determining a state of the PCM cell based, at least in part, on determining whether the substantial decrease in the PCM cell resistance occurs according to Ohm's Law. In one implementation, the state of the PCM cell may be determined to be in a SET state if the substantial decrease in the resistance does not occur, whereas the state of the PCM cell may be determined to be in a RESET state if the substantial decrease in the resistance does occur. In another implementation, determining whether a substantial decrease in PCM cell resistance occurs may comprise maintaining at least one previous value of PCM cell current and/or voltage measurements and comparing at least one previous value of the PCM cell current and/or voltage measurements to a value of a subsequent measurement of the PCM cell current and/or voltage.

FIG. 1 is a schematic diagram of a portion of phase change memory 100, according to an embodiment. Such a portion is shown to include two memory cells, each memory cell being in a different memory state for illustrative purposes. A semiconductor substrate 150 may include N-doped regions 155, though other configurations, including the use of P-doped regions for example, may be used. Phase change memory 100 may include word lines 160, bitline 105, and bit line contact 110. Bitline 105 may be electrically connected to a sense amplifier, for example. To represent one memory state, a heater 145 contacting a portion of phase change material 125 may heat to melt a portion 140 of phase change material 125, which may then be cooled relatively quickly to comprise amorphous GST, for example. Such an amorphous material may be relatively highly resistive (e.g., a RESET state), resulting in a high-resistance connection to a contact 120. To represent another memory state, a heater 135 contacting a portion of phase change material 115 may heat to melt a portion of phase change material 115, which may then be cooled relatively slowly to provide a polycrystalline, low-resistance material (e.g., a SET state). Such polycrystalline phase change material 115 may thus lead to a low-resistance connection to contact 120. Of course, details of such a portion of a PCM are merely examples, and claimed subject matter is not so limited.

As explained above, phase change material 125 in a RESET state may experience a threshold edge while a bias signal is applied to bitline 105. As a result, resistivity of a PCM cell comprising phase change material 125 may change. Accordingly, voltage or current across the PCM cell may correspondingly change. Such a change in current or voltage may be measured in a process to detect whether or not a threshold edge occurs, and thus whether or not the PCM cell is in a RESET state or a SET state. In one implementation, voltage may be measured across bitline 105 and contact 120, for example, though claimed subject matter is not limited in this respect.

Figure 2:
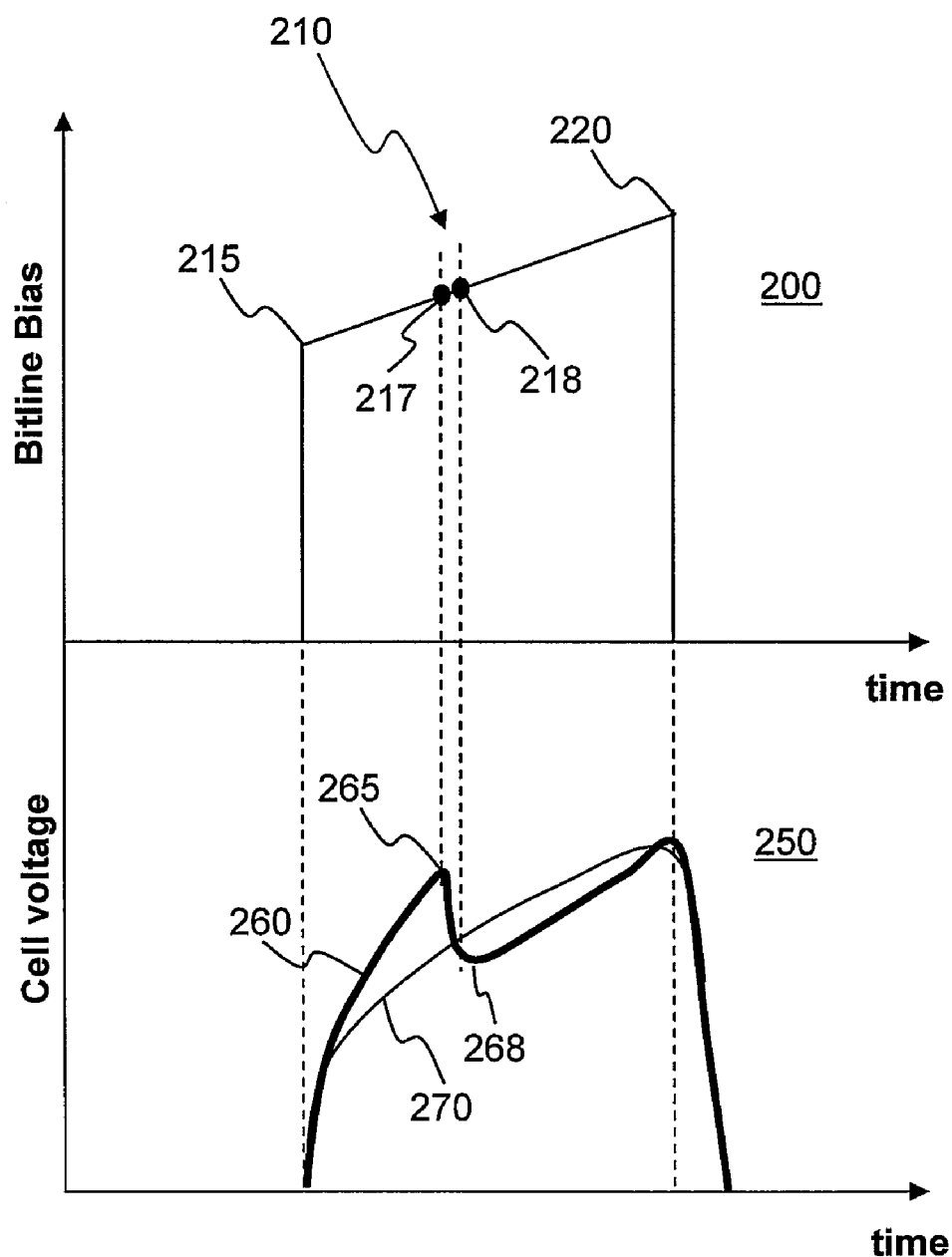
FIG. 2 includes plots showing characteristics of a bias signal wave-form and memory cell voltage/current, according to an embodiment.

FIG. 2 includes plots showing characteristics of a bias signal wave-form and memory cell voltage/resistance, according to an embodiment. In plot 200, bias signal 210 may comprise a voltage or current pulse applied to a PCM cell. In one implementation, bias signal 210 may be applied to a bitline of a PCM cell. Bias signal 210 may comprise a ramping pulse, wherein the ramping pulse begins at a voltage/current magnitude of point 215 and increases to an upper voltage/current magnitude of point 220.

Plot 250 includes examples of voltage across a PCM cell resulting from applying bias signal 210. Though voltage across a PCM cell may be discussed, it is understood that there exists a corresponding current (e.g., related via Ohm's Law) through the PCM cell. In particular, voltage curve 270 may represent voltage across a PCM cell that is in a SET state, whereas voltage curve 260 may represent voltage across the PCM cell that is in a RESET state. In plot 250, it is to be understood that vertical scales of voltage curve 260 and voltage curve 270 may be different. Voltage curve 260 and voltage curve 270 are somewhat superimposed on one another merely to show substantial differences in characteristics, as follows. Voltage curve 270 demonstrates that voltage across a PCM cell in a SET state varies with bias signal 210 applied to the PCM cell. In contrast, voltage curve 260, while generally varying with bias signal 210, includes features such as a voltage peak 265 and a relatively precipitous voltage drop to voltage dip 268. Such features may result from a threshold edge that may occur in a PCM cell that is in a RESET state. For example, changes in voltage across the PCM cell from voltage peak 265 to voltage dip 268 may result from a relatively sudden decrease in PCM cell resistance, as discussed above. In particular, as ramping bias signal 210 reaches a particular magnitude 217, resistance of the PCM cell may begin to drop as ramping bias signal 210 continues to increase. Next, as ramping bias signal 210 reaches a particular magnitude 218, resistance of the PCM cell may drop to a low value (e.g., resistance of the PCM cell before snapback may be relatively high). Of course, such details of bias signals and threshold edge effects are merely examples, and claimed subject matter is not so limited.

Figure 3:
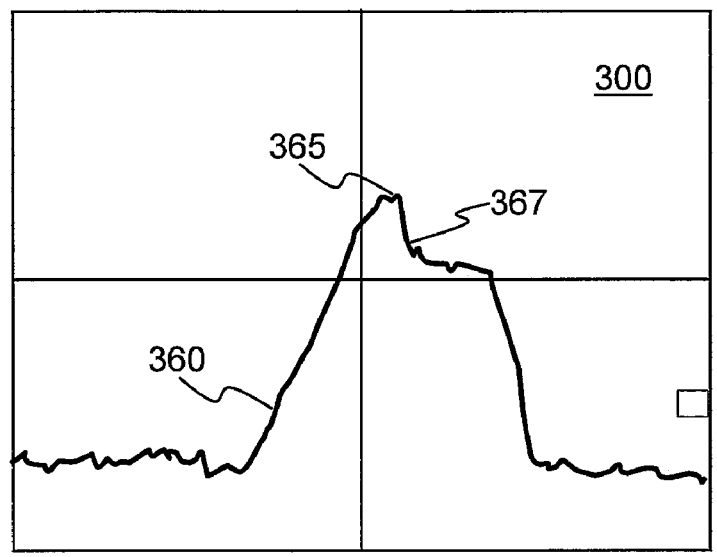
FIG. 3 is a plot showing characteristics of a memory cell versus time, according to an embodiment.

FIG. 3 is a plot 300 showing characteristics of a PCM cell versus time, according to an embodiment. Such characteristics may result from a substantially constant bias signal applied to the PCM cell. Voltage across the PCM memory cell may be measured along a vertical axis of plot 300. In one implementation, plot 300 may comprise measurements of a PCM cell in a RESET state disposed in a particular PCM memory device. Voltage curve 360 may include features resulting from a threshold edge experienced by the PCM cell. In particular, voltage curve 360 includes voltage peak 365 and a relatively precipitous voltage drop 367. As explained above, changes in voltage across the PCM cell at voltage peak 365 may result from a relatively sudden decrease in PCM cell resistance resulting from occurrence of a threshold edge.

Figure 4:
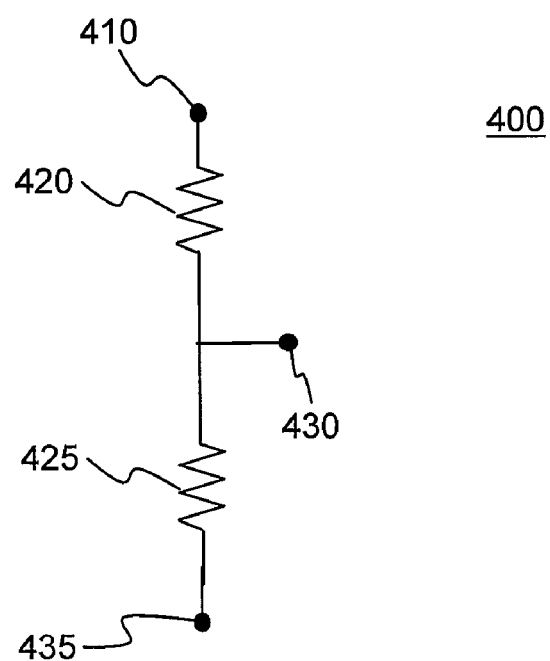
FIG. 4 is a schematic diagram of an electrical circuit to measure characteristics of a memory cell, according to an embodiment.

FIG. 4 is a schematic diagram of an electrical circuit 400 to measure characteristics of a memory cell, according to an embodiment. Such an electrical circuit may comprise a portion of a sense amplifier circuit used to detect a state of the memory cell, for example. As discussed above, a process of determining a state of a PCM cell may involve detecting whether or not the PCM cell experiences a threshold edge. For example, if a threshold edge is detected, then a PCM cell may be considered to be in a RESET state. In an implementation, electrical circuit 400 may be involved in a process to perform such detection. A bias voltage may be applied to node 410. Such a bias voltage may be similar to bias signal 210 shown in FIG. 2, for example. Load resistance 420 and PCM cell resistance 425 may form a voltage divider circuit. Accordingly, voltage measured at node 430 may be used to detect change in PCM cell resistance 425. For example, in one implementation, voltage measured at node 430 may comprise a voltage measured across bitline 105 and contact 120, shown in FIG. 1, though claimed subject matter is not limited in this respect. Such change, for example, may result from a threshold edge.

Figure 5:
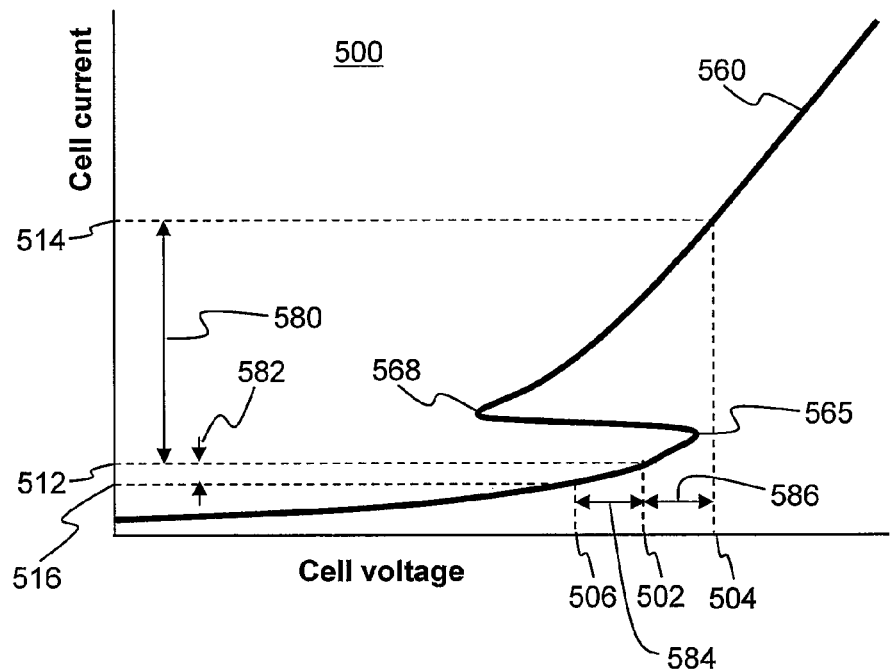
FIG. 5 is a plot showing characteristics of a memory cell and measurement parameters, according to an embodiment.
Figure 6:
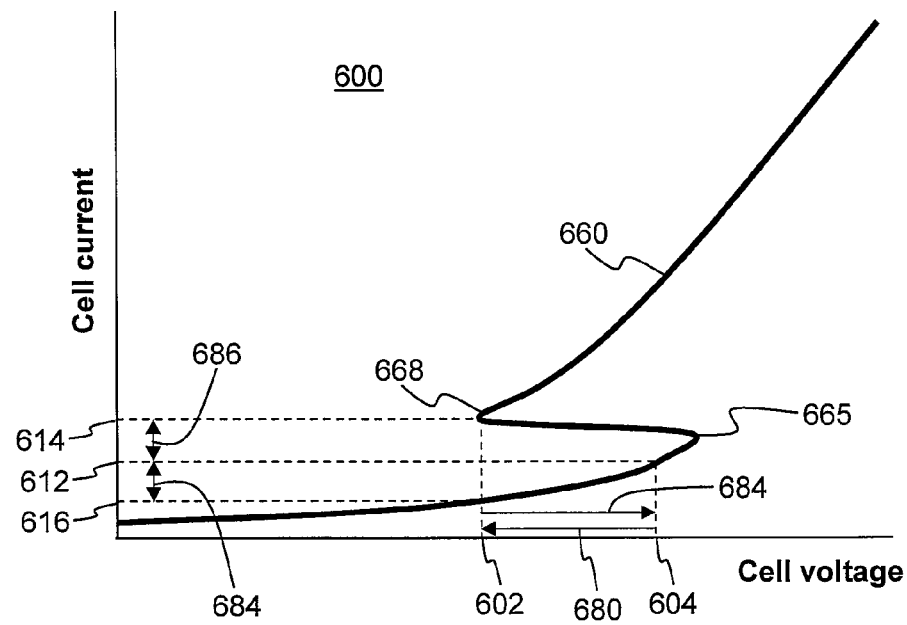
FIG. 6 is a plot showing characteristics of a memory cell and measurement parameters, according to another embodiment.
Figure 7:
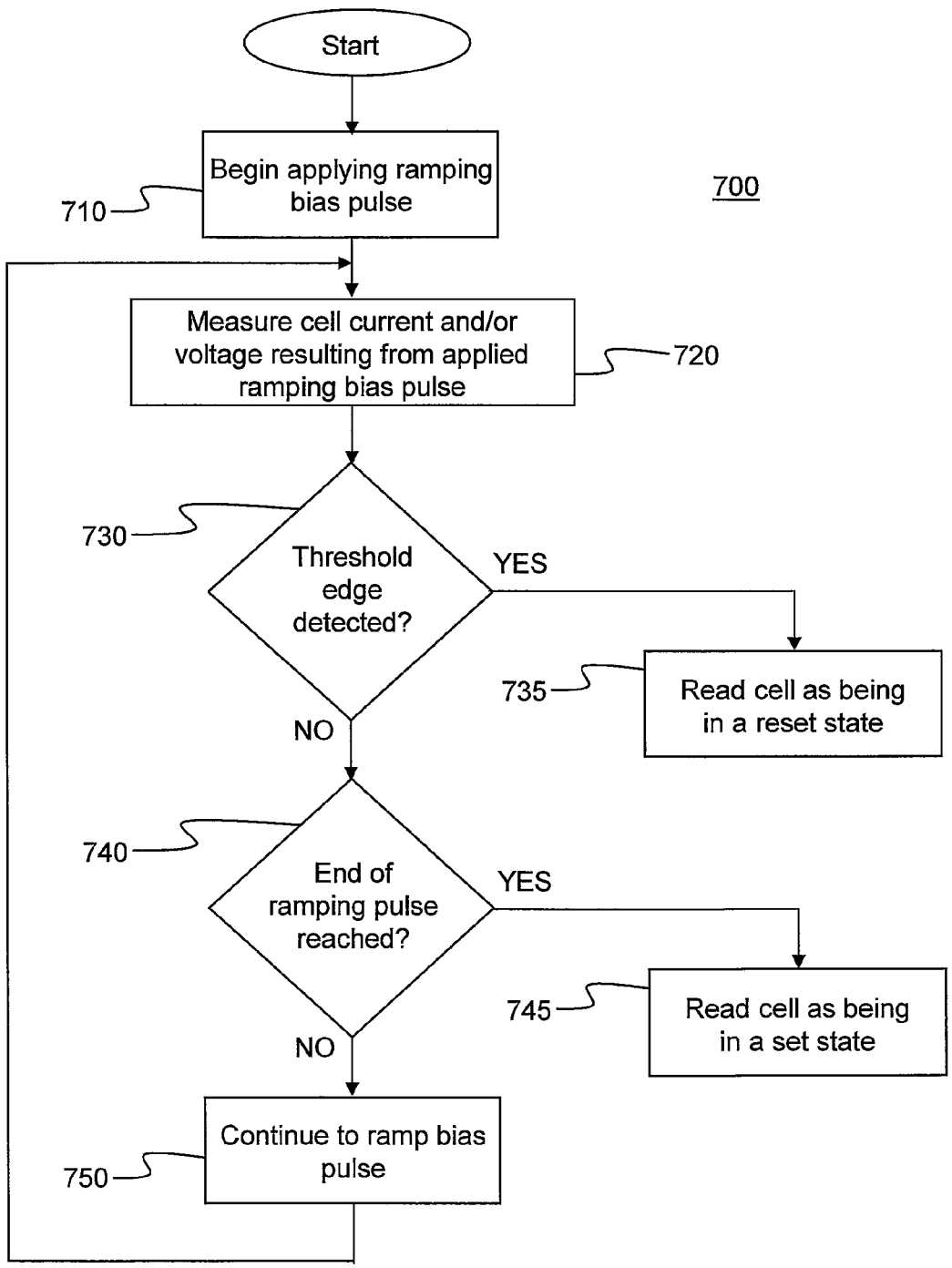
FIG. 7 is a flow diagram of a process to read a memory cell, according to an embodiment.
Figure 8:
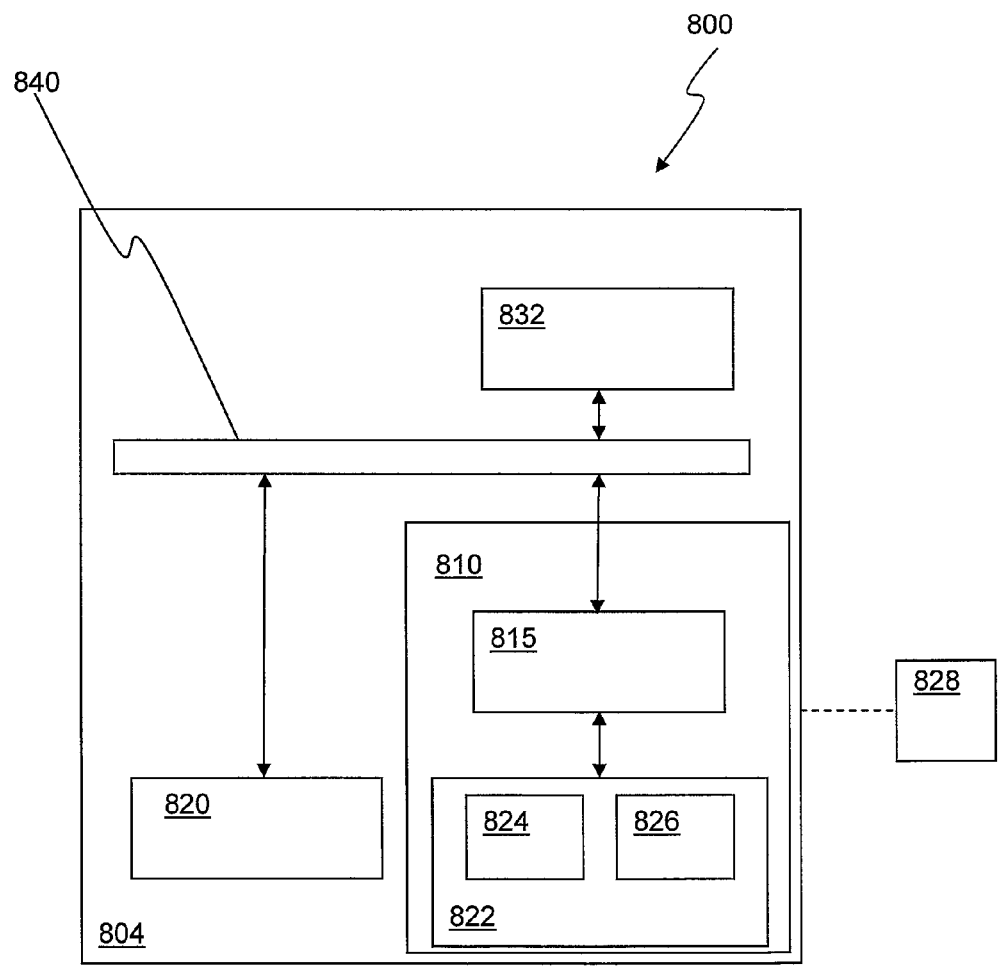
FIG. 8 is a schematic diagram illustrating an exemplary embodiment of a computing system.

In one implementation, voltage at node 430 may be provided to an input terminal of an edge triggered latch circuit (not shown). In such a case, an edge triggered latch circuit may be responsive to transitions of voltage at node 430. For example, such an edge triggered latch circuit may produce one particular signal in response to voltage at node 430 changing relatively rapidly (e.g., transitioning). In contrast, the edge triggered latch may produce another particular signal if voltage at node 430 changes relatively slowly. In an implementation, an edge triggered latch circuit or other circuit may retain information regarding earlier-than-present voltages at node 430. Logic and/or capacitive circuitry, for example, may be incorporated to perform retention of information. Such information may be subsequently compared with present voltages at node 430. Such a comparison may be used to determine a rate at which voltages at node 430 may change. A relatively fast rate may indicate occurrence of a threshold edge, wherein a PCM cell may be in a RESET state. On the other hand, a relatively slow rate may indicate absence of a threshold edge. In such a case, a bias pulse being applied to the PCM cell may be further increased (e.g., ramped upward) until a threshold edge is detected (if the PCM cell is in a RESET state) or until a particular bias magnitude is reached, as described in detail below. Of course, such details of circuitry used to measure threshold edge are merely examples, and claimed subject matter is not so limited FIG. 5 is a plot 500 showing characteristics of a memory cell in a RESET state, according to an embodiment. In particular, curve 560 may represent PCM cell current as a function of cell voltage in response to a bias signal applied to the PCM cell. The bias signal, such as bias signal 210 shown in FIG. 2, for example, may comprise a ramping pulse. The portion of curve 560 shown in plot 500 may represent cell voltage and cell current of the PCM cell during a ramping portion of bias signal 210, such as from point 215 to point 220 in plot 200. As the magnitude of the bias signal is increased, cell voltage and cell current correspondingly increase to point 565. As the magnitude of the bias signal is further increased, a threshold edge may be reached just past point 565. As a result, as the magnitude of the bias signal is still further increased, cell voltage abruptly drops and cell current increases to point 568. Such an abrupt drop in voltage may be referred to as "snapback". In one implementation, a technique for detecting whether or not snapback occurs, and thus whether or not a PCM cell is in a RESET state, may involve measuring a change in cell current for a particular change in cell voltage. For example, because snapback occurs during a voltage change 586 between cell voltages 502 and 504, a corresponding change 580 in current, from cell current 512 to cell current 514, may be relatively large. On the other hand, if a snapback were not to occur, such as during a voltage change 584 between cell voltages 506 and 502, a corresponding change 582 in current, from cell current 516 to cell current 512 may be relatively small. Of course, such details of characteristics of a memory cell are merely examples, and claimed subject matter is not so limited FIG. 6 is a plot 600 showing characteristics of a memory cell in a RESET state, according to an embodiment. Similar to that shown in FIG. 5, curve 560 may represent PCM cell current as a function of cell voltage in response to a bias signal applied to the PCM cell. However, in the case of FIG. 5, a voltage supply may be used to apply a bias signal to the PCM cell, whereas in the case of FIG. 6, a current supply may instead be used to apply a bias signal to the PCM cell. Accordingly, in one implementation, a technique for detecting whether or not snapback occurs, and thus whether or not a PCM cell is in a RESET state, may involve measuring a change in cell voltage for a particular change in cell current. In particular, such a technique may involve measuring whether the change in cell voltage increases or decreases while cell current is increased. For example, because snapback occurs while cell current increases from cell current 612 to cell current 614, a corresponding decrease 680 in voltage, from cell voltage 604 to cell voltage 602, may occur. On the other hand, if a snapback were not to occur during a particular increase in current, such as during and increase in cell current from cell current from cell current 616 to cell current 612, a corresponding increase 684 in voltage, from cell current 602 to cell current 604, may occur. Thus, determining whether or not a snapback (e.g., a threshold edge) occurs may be based, at least in part, on detecting whether a resulting voltage increases or decreases for an increase in applied cell current. Of course, such techniques of threshold edge detection and details of characteristics of a memory cell are merely examples, and claimed subject matter is not so limited FIG. 7 is a flow diagram of a process 700 to read a memory cell, according to an embodiment. At block 710, a bias signal may be applied to a PCM cell. In one implementation, such a bias signal may comprise a ramping square-wave pulse generated by a voltage supply. In another implementation, such a bias signal may comprise a ramping square-wave pulse generated by a current supply, such as in the case described above regarding FIG. 6. Of course, claimed subject matter is not limited to any particular type of power supply or bias signal characteristics. At block 720, cell current and/or cell voltage resulting from the bias signal applied to the PCM cell may be measured. Such measurements may be performed in a number of ways, including techniques described above, for example. At diamond 730, a process to determine whether a threshold edge has occurred may be performed. Such a determination may be performed using techniques described above, though claimed subject matter is not so limited. If occurrence of a threshold edge is detected, then process 700 may proceed to block 735 where the PCM cell may be determined to be in a RESET state. On the other hand, if a threshold edge is not detected then process 700 may proceed to diamond 740, where a determination may be made as to whether the applied bias signal has reached an upper magnitude, such as point 220 of bias signal 210 shown in FIG. 2, for example. If the bias signal has reached an upper magnitude, then process 700 may proceed to block 745, where the PCM cell may be determined to be in a SET state (since threshold edge was not detected). On the other hand, if the applied bias signal has not reached an upper magnitude then process 700 may proceed to block 750, where the bias signal may be ramped further. Process 700 may then return to block 720 where cell current and/or cell voltage resulting from the increased bias signal may be measured. Process 700 may continue in such a fashion until either a threshold edge is detected or an upper magnitude of the ramping bias signal is reached, though claimed subject matter is not limited in this respect. Of course, such details of process 700 are merely examples, and claimed subject matter is not so limited FIG. 8 is a schematic diagram illustrating an exemplary embodiment of a computing system 800 including a memory device 810. Such a computing device may comprise one or more processors, for example, to execute an application and/or other code. For example, memory device 810 may comprise a memory that includes a portion of PCM 100, shown in FIG. 1. A computing device 804 may be representative of any device, appliance, or machine that may be configurable to manage memory device 810. Memory device 810 may include a memory controller 815 and a memory 822. By way of example but not limitation, computing device 804 may include: one or more computing devices and/or platforms, such as, e.g., a desktop computer, a laptop computer, a workstation, a server device, or the like; one or more personal computing or communication devices or appliances, such as, e.g., a personal digital assistant, mobile communication device, or the like; a computing system and/or, associated service provider capability, such as, e.g., a database or data storage service provider/system; and/or any combination thereof.

It is recognized that all or part of the various devices shown in system 800, and the processes and methods as further described herein, may be implemented using or otherwise including hardware, firmware, software, or any combination thereof. Thus, by way of example but not limitation, computing device 804 may include at least one processing unit 820 that is operatively coupled to memory 822 through a bus 840 and a host or memory controller 815. Processing unit 820 is representative of one or more circuits configurable to perform at least a portion of a data computing procedure or process. By way of example but not limitation, processing unit 820 may include one or more processors, controllers, microprocessors, microcontrollers, application specific integrated circuits, digital signal processors, programmable logic devices, field programmable gate arrays, and the like, or any combination thereof. Processing unit 820 may include an operating system configured to communicate with memory controller 815. Such an operating system may, for example, generate commands to be sent to memory controller 815 over bus 840. Such commands may comprise read and/or write commands. In response to a read command, for example, memory controller 815 may perform process 700 described above, to determined a state of a PCM cell. In one implementation, memory controller 815 may increase a magnitude of a bias signal applied to at least one of an array of PCM cells in response to a read command and infer a value of resistance of the PCM cells by measuring a resulting current and/or voltage of the PCM cells. While increasing the magnitude of the bias signals, the memory controller may determine whether a substantial decrease in the PCM resistance occurs. Memory controller 815 may determine a state of the PCM cells based, at least in part, on determining whether the substantial decrease in the resistance occurs.

Memory 822 is representative of any data storage mechanism. Memory 822 may include, for example, a primary memory 824 and/or a secondary memory 826. Primary memory 824 may include, for example, a random access memory, read only memory, etc. While illustrated in this example as being separate from processing unit 820, it should be understood that all or part of primary memory 824 may be provided within or otherwise co-located/coupled with processing unit 820.

Secondary memory 826 may include, for example, the same or similar type of memory as primary memory and/or one or more data storage devices or systems, such as, for example, a disk drive, an optical disc drive, a tape drive, a solid state memory drive, etc. In certain implementations, secondary memory 826 may be operatively receptive of, or otherwise configurable to couple to, a computer-readable medium 828. Computer-readable medium 828 may include, for example, any medium that can carry and/or make accessible data, code, and/or instructions for one or more of the devices in system 800.

Computing device 804 may include, for example, an input/output 832. Input/output 832 is representative of one or more devices or features that may be configurable to accept or otherwise introduce human and/or machine inputs, and/or one or more devices or features that may be configurable to deliver or otherwise provide for human and/or machine outputs. By way of example but not limitation, input/output device 832 may include an operatively configured display, speaker, keyboard, mouse, trackball, touch screen, data port, etc.

The terms, "and," "and/or," and "or" as used herein may include a variety of meanings that will depend at least in part upon the context in which it is used. Typically, "and/or" as well as "or" if used to associate a list, such as A, B or C, is intended to mean A, B, and C, here used in the inclusive sense, as well as A, B or C, here used in the exclusive sense. Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

While there has been illustrated and described what are presently considered to be example embodiments, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular embodiments disclosed, but that such claimed subject matter may also include all embodiments falling within the scope of the appended claims, and equivalents thereof.

What is claimed is:

1. A method comprising:
    increasing a magnitude of a bias signal applied to a phase change memory (PCM) cell in response to a read command;
    inferring a value of resistance of said PCM cell based, at least in part, on a measurement of a cell current and/or voltage of said PCM cell; and
    determining a state of said PCM cell based, at least in part, on a change in said resistance occurring while said magnitude is increased.

2. The method of claim 1, wherein said determining said state of said PCM cell further comprises:
    determining said state to comprise a set state in an absence of a substantial decrease in said resistance while said magnitude is increased; and
    determining said state to comprise a reset state in the presence of a substantial decrease in said resistance while said magnitude is increased.

3. The method of claim 2, wherein said set state corresponds to a substantially crystalline state of said PCM cell and said reset state corresponds to a substantially amorphous state of said PCM cell.

4. The method of claim 1, wherein said determining whether said change in said resistance occurs further comprises:
    maintaining at least one previous value of said cell current or voltage measurement; and
    comparing said at least one previous value of said cell current or voltage measurement to a value of a subsequent measurement of said cell current or voltage.

5. The method of claim 1, wherein said change in said resistance corresponds to a threshold edge of an amorphous state of said PCM cell.

6. The method of claim 1, wherein said bias signal comprises a single ramping pulse.

7. The method of claim 1, wherein said bias signal is applied to a bitline of said PCM cell.

8. A non-volatile memory controller comprising:
at least one interface to connect to an array of phase change memory (PCM) cells; and
electronic circuitry to:
increase a magnitude of a bias signal applied to at least one of said array of PCM cells in response to a read command;
infer a value of resistance of said at least one of said PCM cells based, at least in part, on a measurement of a cell current and/or voltage of said at least one of said PCM cells; and
determine a state of said at least one of said PCM cells based, at least in part, on a change in said resistance occurring while said magnitude is increased.

9. The non-volatile memory controller of claim 8, wherein said state comprises a set state in an absence of a substantial decrease in said resistance while said magnitude is increased; and wherein said state comprises a reset state in the presence of a substantial decrease in said resistance while said magnitude is increased.

10. The non-volatile memory controller of claim 9, wherein said set state corresponds to a substantially crystalline state of said at least one of said PCM cells and said reset state corresponds to a substantially amorphous state of said at least one of said PCM cells.

11. The non-volatile memory controller of claim 8, further comprises a circuit to:
maintain at least one previous value of said cell current or voltage measurement; and
compare said at least one previous value of said cell current or voltage measurement to a value of a subsequent measurement of said cell current or voltage.

12. The non-volatile memory controller of claim 8, wherein said change in said resistance corresponds to a threshold edge of an amorphous state of said at least one of said PCM cells.

13. The non-volatile memory controller of claim 8, wherein said bias signal comprises a single ramping pulse.

14. A system comprising:
a memory device comprising an array of phase change memory (PCM) cells comprising a phase change material, said memory device further comprising a memory controller to:
increase a magnitude of a bias signal applied to at least one of said PCM cells in response to a read command;
infer a value of resistance of said at least one of said PCM cells based, at least in part, on a measurement of a cell current and/or voltage of said at least one of said PCM cells; and
determine a state of said at least one of said PCM cells based, at least in part, on a change in said resistance occurring while said magnitude is increased; and
a processor to host one or more applications and to initiate said read command to said memory controller to provide access to said memory cells in said memory cell array.

15. The system of claim 14, wherein said state comprises a set state in an absence of a substantial decrease in said resistance while said magnitude is increased; and wherein said state comprises a reset state in the presence of a substantial decrease in said resistance while said magnitude is increased.

16. The system of claim 15, wherein said set state corresponds to a substantially crystalline state of said at least one of said PCM cells and said reset state corresponds to a substantially amorphous state of said at least one of said PCM cells.

17. The system of claim 14, further comprises a circuit to:
maintain at least one previous value of said cell current or voltage measurement; and
compare said at least one previous value of said cell current or voltage measurement to a value of a subsequent measurement of said cell current or voltage.

18. The system of claim 14, wherein said change in said resistance corresponds to a threshold edge of an amorphous state of said at least one of said PCM cells.

19. The system of claim 14, wherein said bias signal comprises a single ramping pulse.

20. The system of claim 14, wherein said bias signal is applied to a bitline of at least one of said PCM cells.

* * * * *